United States Patent
Lee et al.

(10) Patent No.: US 8,469,650 B2
(45) Date of Patent: Jun. 25, 2013

(54) METHOD OF CONTROLLING PRESSURE IN A WAFER TRANSFER SYSTEM

(75) Inventors: Soo-woong Lee, Suwon-si (KR);
Hyung-seok Choi, Yongin-si (KR);
Jung-sung Hwang, Suwon-si (KR);
Sung-hwan Choi, Ohsan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1286 days.

(21) Appl. No.: 12/285,982

(22) Filed: Oct. 17, 2008

(65) Prior Publication Data
US 2009/0053034 A1   Feb. 26, 2009

Related U.S. Application Data

(62) Division of application No. 10/963,541, filed on Oct. 14, 2004, now Pat. No. 7,438,514.

(30) Foreign Application Priority Data

Jun. 29, 2004  (KR) .................................. 2004-49456

(51) Int. Cl.
*H01L 21/677* (2006.01)
*G06F 19/00* (2011.01)
(52) U.S. Cl.
USPC ............................ 414/217; 414/940; 700/112
(58) Field of Classification Search
USPC .................. 700/112, 121, 213, 228; 414/217, 414/805, 935, 937, 938, 940; 438/5
See application file for complete search history.

(56) References Cited

U.S. PATENT DOCUMENTS

| | | | |
|---|---|---|---|
| 5,549,512 A | | 8/1996 | Sinclair et al. |
| 5,562,383 A | * | 10/1996 | Iwai et al. ..................... 414/940 |
| 5,876,280 A | * | 3/1999 | Kitano et al. ................. 414/217 |
| 6,050,891 A | | 4/2000 | Nering |
| 6,074,154 A | * | 6/2000 | Ueda et al. .................... 414/217 |
| 6,224,679 B1 | | 5/2001 | Sasaki et al. |
| 6,364,762 B1 | * | 4/2002 | Kaveh et al. .................. 454/187 |
| 6,399,518 B1 | * | 6/2002 | Ueda .............................. 438/758 |
| 6,402,401 B1 | * | 6/2002 | Ueda et al. ..................... 396/611 |
| 6,409,503 B1 | * | 6/2002 | Yoshida et al. ............... 414/939 |
| 6,425,722 B1 | * | 7/2002 | Ueda et al. ..................... 414/217 |
| 6,500,051 B1 | * | 12/2002 | Nishi et al. ....................... 451/41 |
| 6,585,430 B2 | * | 7/2003 | Matsuyama et al. .......... 396/611 |
| 6,632,281 B2 | * | 10/2003 | Kitano et al. .................... 118/58 |

(Continued)

FOREIGN PATENT DOCUMENTS

| JP | 06-066440 A | 3/1994 |
|---|---|---|
| JP | 07-307372 | 11/1995 |

(Continued)

*Primary Examiner* — Charles Kasenge
(74) *Attorney, Agent, or Firm* — Lee & Morse, P.C.

(57) ABSTRACT

A wafer transfer system, and method of controlling pressure in the system, includes a loadport for receiving a wafer container, a housing operably connected to the loadport, a wafer transfer mechanism for transferring a wafer between the wafer container and the housing, a wafer container sensor for detecting a presence of the wafer container on the loadport, a variable speed fan disposed in a first portion of the housing, a variable exhaust unit disposed in a second portion of the housing facing the first portion, the variable exhaust unit being capable of varying an exhaust rate of air from the housing, and a controller for variably operating the variable speed fan and the variable exhaust unit in response to a signal from the wafer container sensor.

19 Claims, 12 Drawing Sheets

U.S. PATENT DOCUMENTS

| | | | |
|---|---|---|---|
| 6,655,891 B2 * | 12/2003 | Ueda et al. | 414/217 |
| 6,658,917 B2 | 12/2003 | Kim et al. | |
| 6,852,601 B2 * | 2/2005 | Yoshida et al. | 438/308 |
| 7,063,600 B2 * | 6/2006 | Yoshida et al. | 451/67 |
| 7,208,066 B2 * | 4/2007 | Kitano et al. | 156/345.27 |
| 7,438,514 B2 * | 10/2008 | Lee et al. | 414/217 |
| 2001/0013161 A1 * | 8/2001 | Kitano et al. | 29/25.01 |
| 2002/0110769 A1 * | 8/2002 | Yoshida et al. | 432/16 |
| 2003/0094135 A1 | 5/2003 | Komiya et al. | |
| 2004/0050321 A1 * | 3/2004 | Kitano et al. | 118/300 |

FOREIGN PATENT DOCUMENTS

| | | |
|---|---|---|
| JP | 2002-231782 | 8/2002 |
| JP | 2003-510837 A | 3/2003 |
| JP | 3425592 B2 | 7/2003 |

* cited by examiner

METHOD OF CONTROLLING PRESSURE IN A WAFER TRANSFER SYSTEM

CROSS REFERENCE TO RELATED APPLICATION

This is a divisional application based on application Ser. No. 10/963,541, filed Oct. 14, 2004 now U.S. Pat. No. 7,438,514, the entire contents of which is hereby incorporated by reference.

BACKGROUND OF THE INVENTION

1. Field of the Invention

The present invention relates to a wafer transfer system. More particularly, the present invention relates to a wafer transfer system for use in a semiconductor manufacturing process and a method of controlling pressure in the wafer transfer system by varying air flow into and out of the system.

2. Description of the Related Art

During semiconductor processing, wafers are required to be transferred from one location to another location. For example, wafers are required to be transferred from a wafer container into process equipment. A wafer transfer system is necessary to perform this transfer. In view of the high degree of cleanness that must be provided in semiconductor manufacturing, all areas in the semiconductor manufacturing process to which the wafers are exposed, including the wafer transfer system, must be maintained at a very high level of cleanness.

By effectively maintaining a high degree of cleanness in the wafer transfer system, a processing wafer and a wafer container can avoid initial contamination or re-contamination by a contaminated wafer container or wafer transfer system.

Conventionally, to eliminate contamination during a semiconductor manufacturing process, the manufacturing process was performed in a clean room maintained in a high degree of cleanness and an open type container was used to store and transfer wafers.

In an effort to reduce maintenance costs of the clean room, an equipment part of the clean room is selectively maintained in a relatively high degree of cleanness, while the remainder of the clean room is maintained in a relatively low degree of cleanness. Accordingly, it is necessary to use a sealed type wafer container to prevent the wafers from becoming contaminated when the wafers are in an area having a relatively low degree of cleanness.

The equipment part of the clean room includes a wafer transfer system for transferring wafers into the process equipment from the wafer container. The wafer transfer system includes a housing maintained locally in a high degree of cleanness. The housing includes a blowing fan in an upper area thereof for blowing clean air downwardly and an exhaust valve in a lower portion thereof for exhausting air.

During a transfer process in the wafer transfer system, particles are generated in the housing by operation of a wafer transfer robot. These particles attach in slots in the wafer container due to a flow of air when the wafer container is opened or closed. A processed wafer is contaminated by particles attached onto the slots, and other wafers (not processed) are also contaminated in the housing before being transferred into the process equipment.

One example of particle contamination is nano-sized particles, i.e., particles having a size on the order of nanometers. Nano-sized particles, or nanoparticles, require a high blowing speed of the fan to remove the particles. An amount of electricity consumed by the fan rotating at a high speed in an effort to remove nanoparticles is extremely high. Moreover, when a hole size of a conventional exhaust valve is not sufficiently large, not all of the nanoparticles are sufficiently exhausted. Resultantly, the nanoparticles accumulate adjacent to the exhaust valve and eventually move up to the top area of the housing. This insufficient exhausting results in a "whirlpool effect" of air and particles in the housing.

Conventional wafer transfer systems have attempted to increase a speed of the blowing fan to remove additional particles in the housing. However, significant electricity is consumed due to the high speed and continuous rotation of the blowing fan. In an effort to reduce electricity consumption, other conventional wafer transfer systems have operated a fan at two speeds. However, when a blowing speed of the fan is reduced to conserve energy, sufficient differential pressure between the housing and the clean room may be lost and contamination may enter the housing.

SUMMARY OF THE INVENTION

The present invention is therefore directed to a wafer transfer system and method of controlling pressure in the system, which substantially overcome one or more of the problems due to the limitations and disadvantages of the related art.

It is a feature of an embodiment of the present invention to provide a wafer transfer system and method of controlling pressure in the wafer transfer system that is capable of reducing electricity consumption.

It is another feature of an embodiment of the present invention to provide a wafer transfer system and method of controlling pressure in the wafer transfer system that is capable of removing nano-sized particles.

At least one of the above features and other advantages may be provided by a wafer transfer system including a loadport for receiving a wafer container, a housing operably connected to the loadport, a wafer transfer mechanism for transferring a wafer between the wafer container and the housing, a wafer container sensor for detecting a presence of the wafer container on the loadport, a variable speed fan disposed in a first portion of the housing, a variable exhaust unit disposed in a second portion of the housing facing the first portion, the variable exhaust unit being capable of varying an exhaust rate of air from the housing, and a controller for variably operating the variable speed fan and the variable exhaust unit in response to a signal from the wafer container sensor.

The housing may include an upper surface having an air intake therein, a bottom surface, and side surfaces, and a first opening through a side surface of the housing, the first opening providing communication between the wafer container and an interior of the housing.

The wafer container may include a door, and the wafer transfer system may further include a door assembly for opening and closing the door of the wafer container through the first opening.

The wafer transfer mechanism may be a wafer transfer robot.

The first portion may be an upper portion of the housing and the second portion may be a lower portion of the housing.

The wafer container may be a front open unified port (FOUP). The housing may be an equipment front end module (EFEM). The door assembly may include a door holder and a transfer arm.

The variable speed fan may be disposed on an interior of the upper surface of the housing. The wafer transfer system may further include a filter positioned between the variable speed fan and the interior of the housing. The wafer transfer system may further include a motor for operating the variable speed fan at varying speeds in response to a signal from the controller. The variable exhaust unit may be disposed on the bottom surface of the housing.

In a first embodiment of the present invention, the variable exhaust unit may include a first exhaust plate including a plurality of first openings and a second exhaust plate including a plurality of second openings, the first exhaust plate and the second exhaust plate being operable to move relative to one another, thereby aligning or misaligning the plurality of first openings and the plurality of second openings. The variable exhaust unit may further include a guide frame on either the first or second exhaust plate, the guide frame including a groove on an interior surface thereof for receiving the other of the first or second exhaust plate, the guide frame providing for horizontal relative movement of either the first or the second exhaust plate. The variable exhaust unit may further include an operating mechanism to move either the first exhaust plate or the second exhaust plate relative to the other.

Each of the plurality of first and/or second openings may be substantially circular, and may have a diameter of between about 3-4 cm, or may be substantially rectangular or substantially square, and may have a width of between about 3-4 cm. The plurality of first openings and the plurality of second openings may be each arranged in a plurality of rows. A distance between each of the plurality of rows may be about 3-4 cm.

In a second embodiment of the present invention, the variable exhaust unit may include a first exhaust plate including a plurality of first openings, a second exhaust plate including a plurality of second openings, and a third exhaust plate including a plurality of third openings, the second exhaust plate being positioned between the first and third exhaust plates, the second plate being operable to move relative to the first and third plates, thereby aligning or misaligning the plurality of first through third openings.

The variable exhaust unit may further include an operating mechanism to move the second exhaust plate relative to the first and third exhaust plates.

The variable speed fan may operate at a first speed when the wafer container sensor fails to detect the presence of the wafer container and at a second speed when the wafer container sensor detects the presence of the wafer container. The first speed may be lower than the second speed. The first speed may produce a blowing speed of about 0.34 m/s. The second speed may produce a blowing speed of about 0.50 m/s.

The variable exhaust unit may be disposed in a first position when the wafer container sensor fails to detect the presence of the wafer container and in a second position when the wafer container sensor detects the presence of the wafer container. An exhaust rate in the first position may be lower than an exhaust rate in the second position. An exhaust rate in the first position may be about 30% and an exhaust rate in the second position may be between about 50% to 70%.

In the first position, the plurality of first openings and the plurality of second openings may be misaligned. Alternatively, in the first position, the plurality of first openings, the plurality of second openings, and the plurality of third openings may be misaligned. In the second position, the plurality of first openings and the plurality of second openings may be aligned. Alternatively, in the second position, the plurality of first openings, the plurality of second openings, and the plurality of third openings may be aligned.

The wafer transfer system may further include a data storage unit for storing predetermined information regarding a speed of the variable speed fan and arrangement of the variable exhaust unit in a first state and a speed of the variable speed fan and arrangement of the variable exhaust unit in a second state, the data storage unit for providing the predetermined information to the controller.

The wafer transfer system may further include a pressure sensor on the housing for measuring a pressure of the interior of the housing and a pressure of a clean room surrounding the housing, the pressure sensor being operable to determine a differential pressure between the interior of the housing and the clean room.

The wafer transfer system may further include a second opening for providing communication between the interior of the housing and process equipment.

At least one of the above features and other advantages may be provided by a method of controlling pressure in a wafer transfer system including maintaining a housing of the wafer transfer system under a first pressure, sensing whether a wafer container is present on a loadport, which is operably connected to the housing, varying an interior pressure condition of the housing from the first pressure to a second pressure, when the wafer container is sensed on the loadport, by operating a variable exhaust unit in the housing to move from a first position providing a relatively low rate of exhaust to a second position providing a relatively high rate of exhaust, and increasing a speed of a variable speed fan in the housing from a first speed to a second speed, the variable exhaust unit and the variable speed fan facing each other, sensing whether the wafer container is removed from the loadport, and returning the housing to the first pressure, when the wafer container is removed from the loadport, by operating the variable exhaust unit to move from the second position to the first position and decreasing the speed of the variable speed fan from the second speed to the first speed.

The first pressure may be lower than the second pressure.

When the wafer container is absent from the loadport, the wafer transfer system may be in a first state in which no component of the wafer transfer system is moving and, when the wafer container is disposed on the loadport, the wafer transfer system may be in a second state in which one or more component of the wafer transfer system is moving. The first state may be a static state and the second state may be a dynamic state.

Operating the variable exhaust unit to move from the first position providing the relatively low rate of exhaust to the second position providing the relatively high rate of exhaust may include moving either a first or a second exhaust plate of the variable exhaust unit relative to the other of the first or second exhaust plate to align a plurality of first openings in the first exhaust plate with a plurality of second openings in the second exhaust plate.

Operating the variable exhaust unit to move from the second position providing the relatively high rate of exhaust to the first position providing the relatively low rate of exhaust may include moving either a first or a second exhaust plate of the variable exhaust unit relative to the other of the first or second exhaust plate to misalign a plurality of first openings in the first exhaust plate with a plurality of second openings in the second exhaust plate.

Operating the variable exhaust unit to move from the first position providing the relatively low rate of exhaust to the second position providing the relatively high rate of exhaust may include moving a second exhaust plate of the variable exhaust unit relative to a first and a third exhaust plate of the variable exhaust unit to align a plurality of second openings in the second exhaust plate with a plurality of first openings in the first exhaust plate and a plurality of third openings in the third exhaust plate.

Operating the variable exhaust unit to move from the second position providing the relatively high rate of exhaust to the first position providing the relatively low rate of exhaust may include moving a second exhaust plate of the variable exhaust unit relative to a first and a third exhaust plate of the variable exhaust unit to misalign a plurality of second openings in the second exhaust plate with a plurality of first openings in the first exhaust plate and a plurality of third openings in the third exhaust plate.

The method may further include storing predetermined information regarding the first and second speeds of the variable speed fan and regarding the first and second positions of the variable exhaust unit in a data storing part and providing the predetermined information from the data storage part to a controller for operating the variable speed fan and the variable exhaust unit.

The method may further include measuring a pressure in the interior of the housing and measuring a pressure in a clean room surrounding the housing using a pressure sensor and determining a differential pressure between the interior of the housing and the clean room. Varying the interior pressure condition of the housing may further include varying a position of the variable exhaust unit to maintain a predetermined pressure condition based on the measured differential pressure between the interior of the housing and the surrounding clean room. Alternatively, varying the interior pressure condition of the housing may further include varying a blowing speed of the variable speed fan to maintain a predetermined pressure condition based on the measured differential pressure between the interior of the housing and the surrounding clean room.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
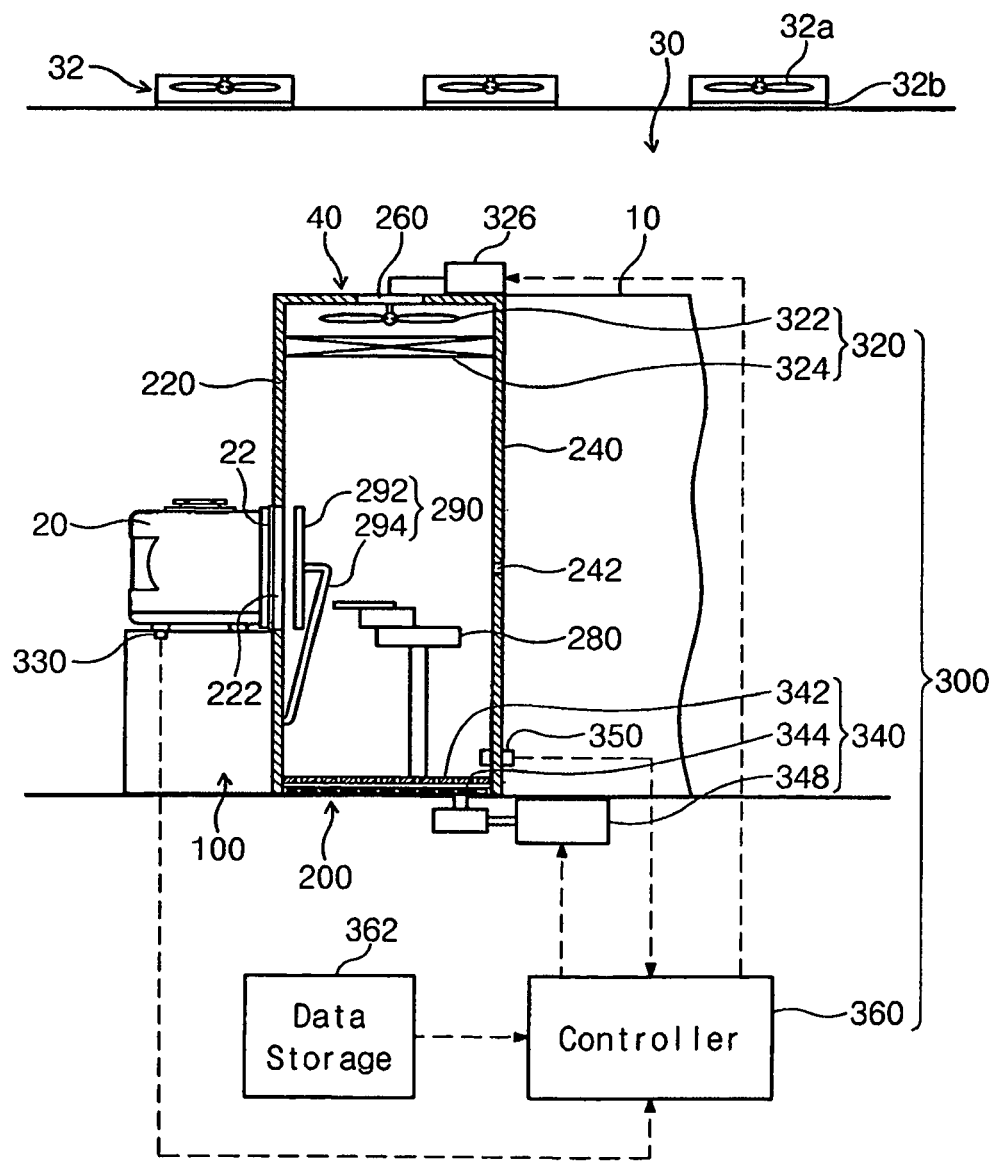
FIG. 1 illustrates a sectional view of a wafer transfer system according to an embodiment of the present invention, the wafer transfer system being disposed in a clean room.

Korean Patent Application No. 2004-49456, filed on Jun. 29, 2004, in the Korean Intellectual Property Office, and entitled: "Wafer Transfer System and Method of Controlling Pressure in the System," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals and characters refer to like elements throughout.

FIG. 1 illustrates a clean room 30, which is used in a semiconductor manufacturing process. The clean room 30 includes a wafer transfer system 40 according to an embodiment of the present invention, process equipment 10, and a fan filter unit 32, which includes a ceiling blowing fan 32a and a filter 32b.

The wafer transfer system 40 includes a loadport 100 for receiving a wafer container 20 and a housing 200 operably connected and adjacent to the loadport 100. The wafer transfer system 40 may be an equipment front end module (EFEM). The housing 200 is required to be maintained in a high degree of cleanness to avoid contaminating and damaging wafers in a semiconductor manufacturing process. The wafer container 20 includes a door 22 to provide access to wafers contained therein. Further, the door 22 prevents an inflow of outside air into the wafer container 20. The wafer container 20 is air tight and may be a front open unified pod (FOUP). In operation, wafers are transferred from the wafer container 20 into the housing 200 by a wafer transfer mechanism, e.g., a wafer transfer robot 280. A wafer container sensor 330 is provided in connection with the loadport 100 to detect a presence of the wafer container 20 on the loadport 100.

Figure 2:
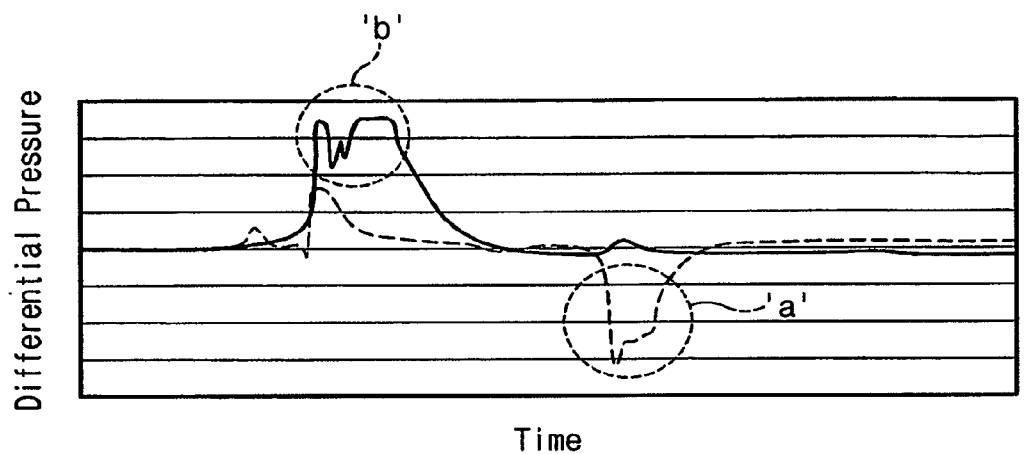
FIG. 2 is a graph of differential pressure versus time.

FIG. 2 is a graph of differential pressure versus time, which shows a pressure difference between the interior of the housing 200 and the interior of the wafer container 20 when the wafer container 20 is opened or closed to provide access to the wafers.

In FIG. 2, the dotted line represents a variation in pressure when the wafer container is opened and the solid line represents a variation in pressure when the wafer container is closed. Referring to region 'a', when the wafer container is opened, an interior pressure of the wafer container decreases to that of the housing, and then due to this pressure difference, air flows into the wafer container from the housing. Referring to region 'b', when the wafer container is closed, air flows into the wafer container from the housing, and the interior pressure of the wafer container increases.

Due to this pressure difference resulting from the opening and closing of the wafer container door, a particle from the housing may enter the wafer container.

Figure 3:
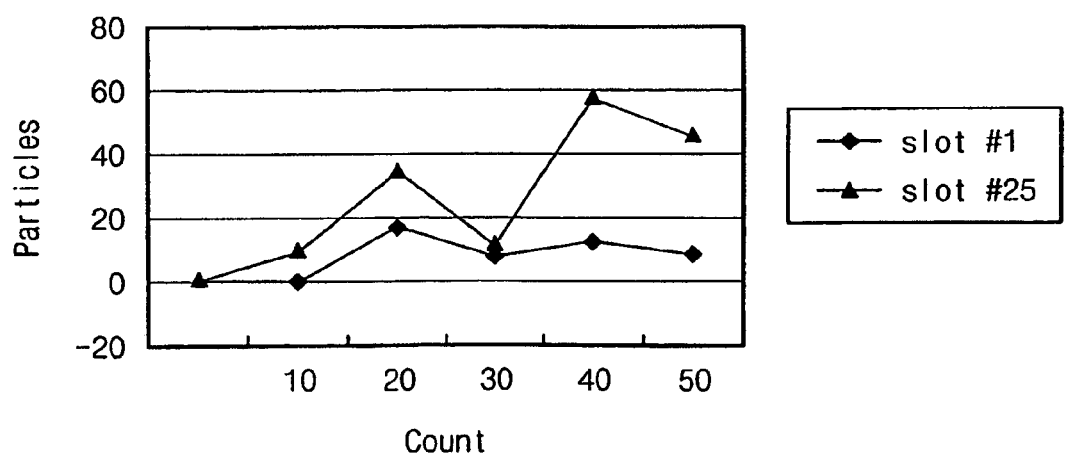
FIG. 3 is an exemplary plot of particle contamination in a wafer container versus frequency of accessing the wafer container, i.e., opening and closing a door of the wafer container.

FIG. 3 is an exemplary plot of particle contamination in the wafer container versus frequency of accessing the wafer container, i.e., opening and closing the wafer container. In FIG. 3, a first plot represents a top slot (slot #25) in the wafer container and a second plot represents a bottom slot (slot #1) in the wafer container. As may be seen in FIG. 3, when the wafer container door is first opened at a top area thereof, a relatively large number of particles are detected in the top slot (slot #25) of the wafer container, and a relatively fewer number of particles are detected in the bottom slot (slot #1). Further, it may be seen that as the wafer container repeatedly accessed, the number of particles therein increases, especially at the top slot, viz., slot #25.

Referring back to FIG. 1, the housing 200 includes an upper surface having an air intake 260, a bottom surface, a first side surface 220, and a second side surface 240. Air from the clean room 30, which surrounds the wafer transfer system 40, is able to enter the housing 200 through the air intake 260. The first side surface 220 of the housing 200 includes a first opening, i.e., a first wafer transfer pathway 222, between the housing 200 and the wafer container 20. The first wafer transfer pathway 222 provides communication between the wafer container 20 and an interior of the housing 200. The second side surface 240 of the housing 200 includes a second opening, i.e., a second wafer transfer pathway 242, between the housing 200 and the process equipment 10.

The wafer transfer system 40 includes a door assembly 290 for opening and closing the door 22 of the wafer container 20 through the first wafer transfer pathway 222. The door assembly 290 may include a door holder 292 for detaching the door 22 from the wafer container 20 and a transfer arm 294 for operating the door holder 292.

The housing 200 further includes a pressure adjusting unit 300 for varying a degree of cleanness in the housing 200. The pressure adjusting unit 300 includes a variable speed fan-filter unit 320, a variable exhaust unit 340, and a controller 360. The variable speed fan-filter unit 320, which may be disposed in an upper portion of the housing 200, includes a variable speed fan 322 and a filter 324 for removing particles from air flowing into the housing 200. The variable speed fan 322 may be disposed on an interior of the upper surface of the housing 200. The filter 324 may be positioned between the variable speed fan 322 and the interior of the housing 200. A motor 326 operates the variable speed fan 322 at varying speeds in response to a signal from the controller 360.

The variable exhaust unit 340, which may be disposed in a lower portion of the housing 200, includes a first exhaust plate 342, a second exhaust plate 344, and an operating mechanism 348 for moving one of the first or second exhaust plates 342, 344 to vary an exhaust rate of the variable exhaust unit 340. The variable exhaust unit 340 may be disposed on the bottom surface of the housing 200. The controller 360 variably operates the variable speed fan 322 and the variable exhaust unit 340 in response to a signal from the wafer container sensor 330. The controller 360 is able to control pressure in the housing 200 by varying a speed of revolution of the variable speed fan 322 and an exhaust rate of the variable exhaust unit 340.

The wafer transfer system 40 operates in two states, viz., a static state and a dynamic state. During operations, the pressure adjusting unit 300 varies a degree of cleanness in the housing 200 by varying pressure in the housing 200 based on whether the wafer transfer system 40 is in the static state or the dynamic state. In the static state, no operations are occurring and no parts are moving. In the dynamic state, operations are in progress and parts are moving, e.g., the door assembly 290 is opening or closing the door 22 of the wafer container 20 or the wafer transfer robot 280 is engaging wafers to either load or unload the wafer container 20 or the process equipment 10.

Figure 4:
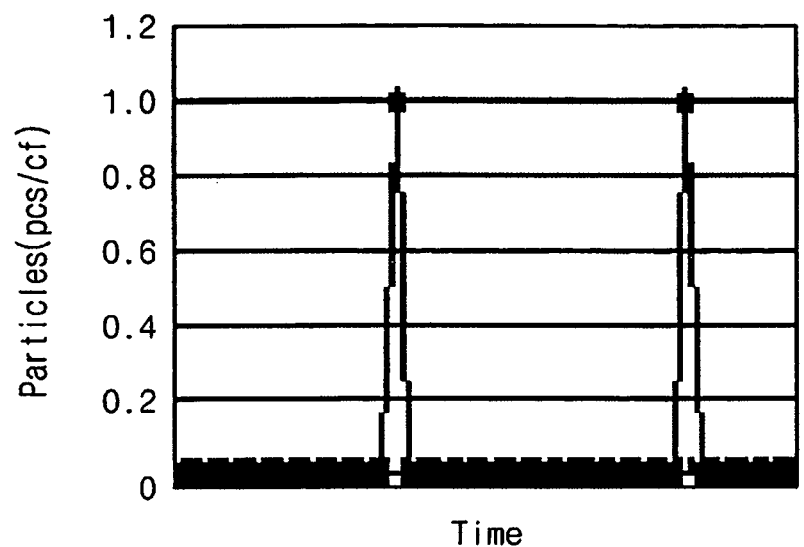
FIGS. 4 and 5 are exemplary plots of particle contamination versus time during a static state and a dynamic state, respectively.
Figure 5:
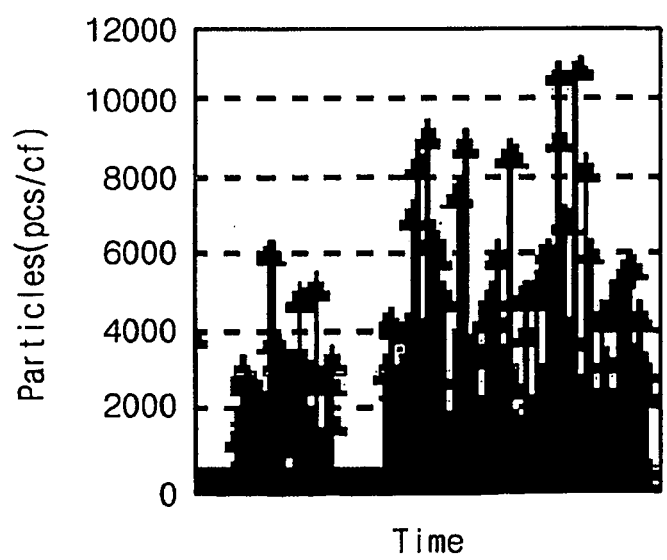

FIGS. 4 and 5 are exemplary plots of particle contamination versus time during the static state and the dynamic state, respectively. FIGS. 4 and 5 show an amount of particles in the housing 200 according to whether the transfer process is in progress in the wafer transfer system 40. When the transfer process is not in progress, i.e., the wafer transfer system 40 is in the static state, the transfer robot 280 in the housing 200 is not moving. Accordingly, virtually no particles are detected in the housing 200 during the static state, as shown FIG. 4. In FIG. 5, however, when the transfer process is in progress, the transfer robot 280 in the housing 200 is moving. Accordingly, a large number of particles are detected in the housing 200, as shown in FIG. 5, due to the mechanical operation of the transfer robot 280. In FIG. 5, in connection with the dynamic state, the variable speed fan 322 is blowing at a conventional speed of 0.34 m/s and the measured particles have a size of greater than 0.1 μm. A conventional blowing speed of 0.34 m/s is used to emphasize a difference in particle contamination between the static state and the dynamic state. As will be discussed in greater detail below, in the present invention, a blowing speed of greater than 0.34 m/s is used in the dynamic state, which reduces particle contamination in the dynamic state. In the context of the present invention, blowing speed represents the speed at which air moves away from the variable speed fan 322.

Accordingly, when the wafer transfer system 40 is in the dynamic state, the interior of the housing 200 is required to be maintained in a higher degree of cleanness, as compared to the static state. This higher degree of cleanness may be obtained by increasing the blowing speed of the variable speed fan 322 and increasing an exhaust rate of the variable exhaust unit 340. When the wafer transfer system 40 is in the static state, the interior of the housing 200 may be maintained in a relatively lower degree of the cleanness. This relatively lower degree of the cleanness may be obtained by decreasing the blowing speed of the variable speed fan 322 and decreasing the exhaust rate of the variable exhaust unit 340.

Figure 6:
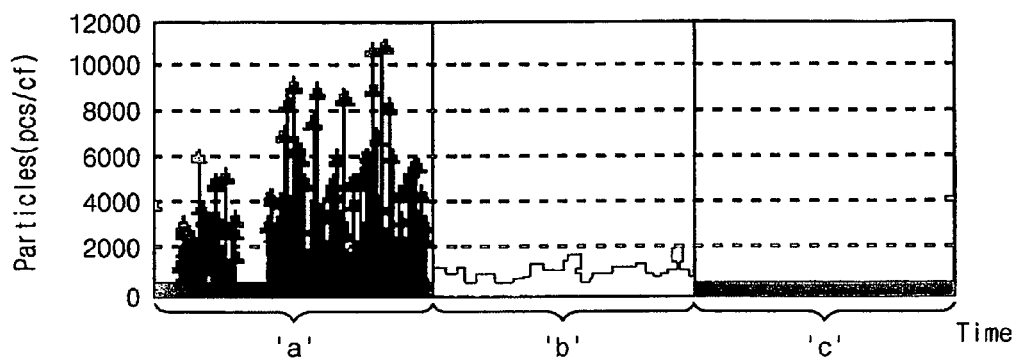
FIG. 6 is a plot of particle contamination versus blowing speed of a fan during a dynamic state, in which the transfer robot is operating.

FIG. 6 is a plot of particle contamination versus blowing speed of the fan during the dynamic state in which the transfer robot is operating. More specifically, FIG. 6 shows an effect of the speed of the air in the housing on a degree of the cleanness in the housing, i.e., a level of particle contamination.

As shown in FIG. 6, as the blowing speed increases, an amount of particles decreases. Specifically, in region 'a', a blowing speed is set at 0.34 m/s, in region 'b' a blowing speed is set at 0.44 m/s, and in region 'c', a blowing speed is set at 0.50 m/s. A blowing speed of 0.44 m/s is necessary to remove microparticles and a blowing speed of 0.50 m/s is necessary to remove nanoparticles.

It is not practical, however, to maintain a blowing speed of 0.50 m/s at all times in view of the attendant consumption of electricity. Moreover, simply reducing the blowing speed at certain times results in a loss of sufficient differential pressure and an increase in contamination in the housing. Sufficient differential pressure must be maintained to prevent particle contamination from entering the housing from the surrounding clean room.

Because it is important to maintain a positive differential pressure between the interior of the housing 200 and the surrounding clean room 30, it is not sufficient to vary only the blowing speed of the variable speed fan 322. An exhaust rate must be correspondingly varied. For example, if the fan speed is too fast and the exhaust rate is too low, air is not exhausted fast enough, thereby re-circulating up from the bottom of the housing 200 and causing a "whirlpool effect." Further, this situation is not able to eliminate nanoparticles. If the fan blowing speed is too slow and the exhaust rate is too high, a positive differential pressure between the interior of the housing 200 and the surrounding clean room 30 is not maintained, so that contamination is able to enter the housing 200. Accordingly, in the wafer transfer system 40 according to an embodiment of the present invention, as the fan blowing speed increases to increase a cleanness of the housing 200, the exhaust rate correspondingly increases to eliminate nanoparticles. Conversely, as the fan blowing speed decreases to conserve energy, the exhaust rate correspondingly decreases, thereby maintaining sufficient differential pressure to avoid contamination of the housing 200.

In operation, the variable speed fan 322 operates at a first speed to produce a first blowing speed when the wafer container sensor 330 fails to detect the presence of the wafer container 20, i.e., the wafer transfer system 40 is in the static state, and at a second speed to produce a second blowing speed when the wafer container sensor 330 detects the presence of the wafer container 20, i.e., the wafer transfer system 40 is in the dynamic state. The first speed, which may produce a blowing speed of about 0.34 m/s is lower than the second speed, which may produce a blowing speed of about 0.50 m/s.

Correspondingly, the variable exhaust unit 340 is disposed in a first position when the wafer container sensor 330 fails to detect the presence of the wafer container 20 (static state) and in a second position when the wafer container sensor 330 detects the presence of the wafer container 20 (dynamic state). An exhaust rate in the first position, which may be about 30%, is lower than an exhaust rate in the second position, which may be between about 50% to 70%. The exhaust rate is calculated by dividing a total area of the openings through which air may pass by a total area of an exhaust plate supporting the openings. The first and second positions of the variable exhaust unit 340 will be described below in connection with FIGS. 10A-11B.

Referring back to FIG. 1, the wafer transfer system 40 may further include a data storage unit 362 for storing predetermined information regarding a blowing speed of the variable speed fan 322 and an arrangement of the variable exhaust unit 340 in a first state, i.e., the static state, and a blowing speed of the variable speed fan 322 and an arrangement of the variable exhaust unit 340 in a second state, i.e., the dynamic state. The data storage unit 362 improves an efficiency of the wafer transfer system 40 by providing the predetermined information to the controller 360.

The wafer transfer system may further include a pressure sensor 350 on the housing 200 for measuring a pressure of the interior of the housing 200 and a pressure of the clean room 30 surrounding the housing 200. The pressure sensor 350 is operable to determine a differential pressure between the interior of the housing 200 and the clean room 30.

The wafer transfer system 40 according to an embodiment of the present invention is able to maintain a predetermined differential pressure between the interior of the housing 200 and the clean room 30. More specifically, the wafer transfer system 40 is able to vary a blowing speed of the variable speed fan 322 or an exhaust rate of the variable exhaust unit 340 in order to maintain a predetermined pressure condition.

Figure 7:
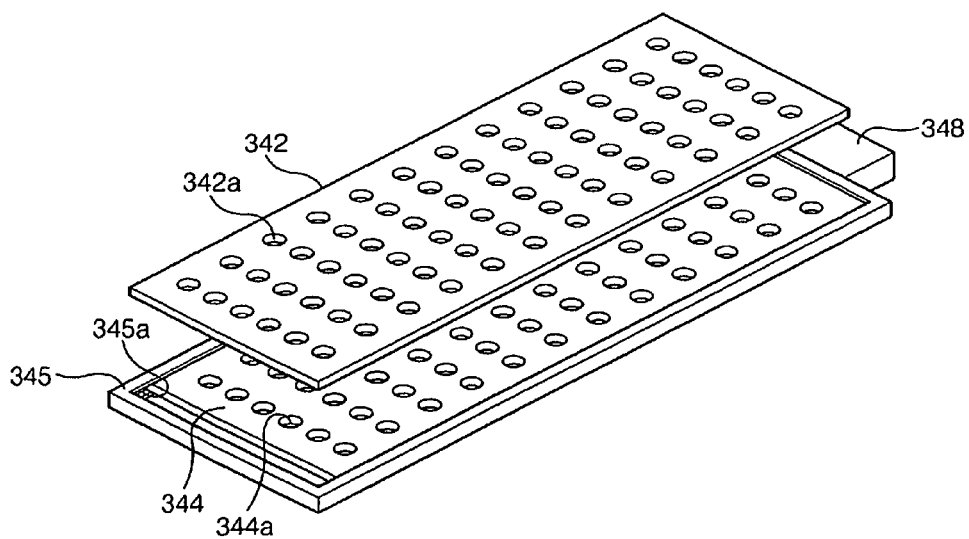
FIG. 7 illustrates a perspective view of a variable exhaust unit according to a first embodiment of the present invention.
Figure 8A:
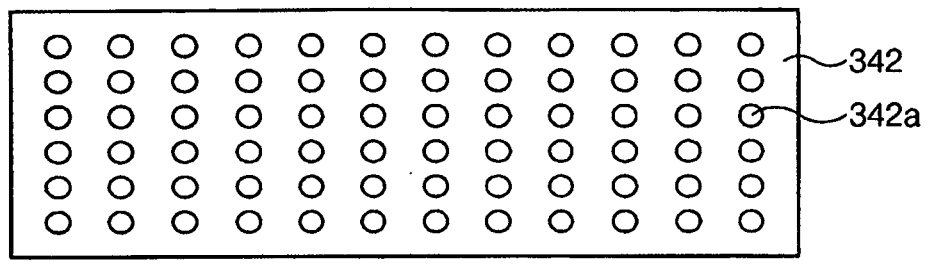
FIGS. 8A through 8C illustrate a top view of a first exhaust plate, a top view of an alternative first exhaust plate, and a top view of another alternative first exhaust plate of the variable exhaust unit as shown in FIG. 7.
Figure 8B:
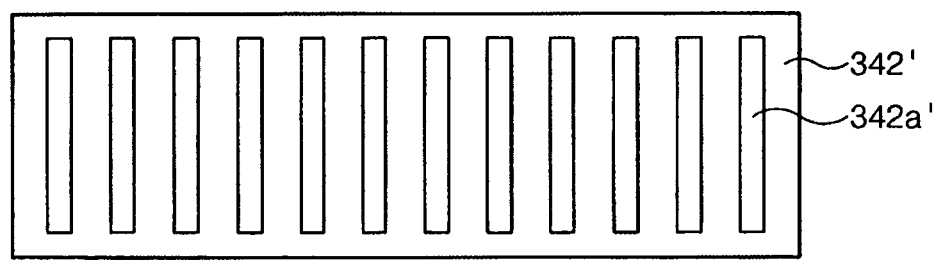
Figure 8C:
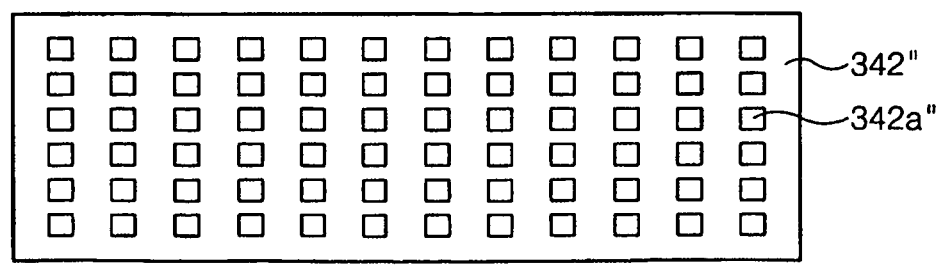

FIG. 7 illustrates the variable exhaust unit 340 according to a first embodiment of the present invention. FIGS. 8A through 8C illustrate top views of the first exhaust plate 342, an alternative first exhaust plate 342', and another alternative first exhaust plate 342", respectively, of the variable exhaust unit 340 shown in FIG. 7.

The variable exhaust unit 340 includes the first exhaust plate 342 and the second exhaust plate 344 separated by a predetermined distance, e.g. about 1 cm. The first exhaust plate 342 includes a plurality of first openings 342a, which acts as a first exhaust route. The second exhaust plate 344 includes a plurality of second openings 344a, which acts as a second exhaust route. The plurality of first and second openings 342a and 344a may be substantially circular, as depicted in FIG. 8A. Alternatively, the variable exhaust unit 340 may include a plurality of substantially rectangular first openings 342a' in the alternative first exhaust plate 342', as depicted in FIG. 8B. In yet another alternative, the variable exhaust unit 340 may include a plurality of substantially square first openings 342a" in the another alternative first exhaust plate 342", as depicted in FIG. 8C. The variable exhaust unit 340 may also include a plurality of substantially rectangular second openings 344a' in an alternative second exhaust plate 344'. When the plurality of first or second openings 342a and 344a are substantially circular, each may have a diameter of between about 3-4 cm. When the plurality of first or second openings are substantially rectangular or square, e.g., second openings 344a', each may have a width of between about 3-4 cm. Each of the plurality of first and second openings may have the same diameter or width. Further, the plurality of first and second openings may be formed in a plurality of rows and columns. Each of the rows and columns may have a predetermined distance therebetween, e.g., about 3-4 cm.

The second exhaust plate 344 may further include a guide frame 345 for conducting the horizontal movement of the second exhaust plate 344. An inner wall of the guide frame 345 has a groove 345a for receiving an edge of the second exhaust plate 344. The second exhaust plate 344 moves between the first position and the second position along the groove 345a of the guide frame 345. The second exhaust plate 344 is operated by the operating mechanism 348. As described above, the controller 360 adjusts the movement of the second exhaust plate 344 by controlling the operating mechanism 348. Although in an exemplary embodiment of the present invention, the second exhaust plate 344 is described as being moved by the operating mechanism 348 relative to the first exhaust plate 342, in an alternative arrangement, the operating mechanism 348 may control the first exhaust plate 342 to move relative to the second exhaust plate 344. In that arrangement, the guide frame 345 may be alternatively disposed on the first exhaust plate 342.

Figure 9A:
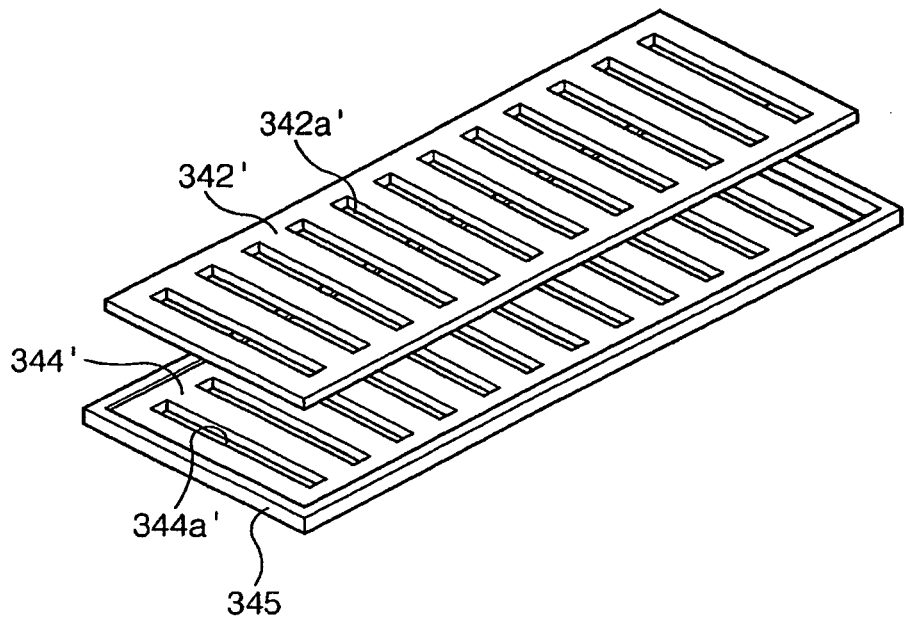
FIGS. 9A and 9B illustrate perspective views of alternate configurations of the variable exhaust unit according to the first embodiment of the present invention.
Figure 9B:
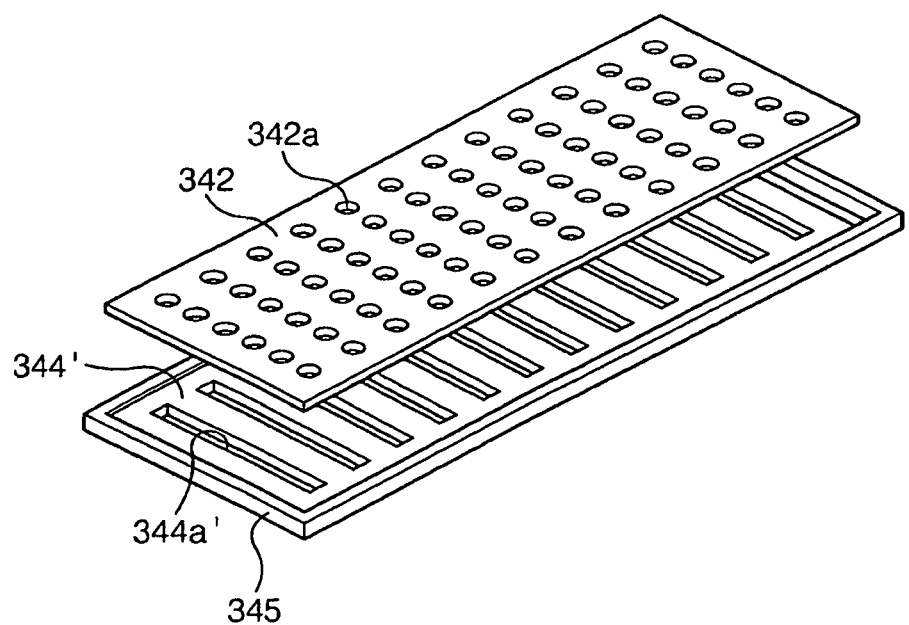

FIGS. 9A and 9B illustrate alternative embodiments of the variable exhaust unit 340 according to the first embodiment of the present invention.

As may be seen in FIGS. 9A and 9B, the plurality of first and/or second openings 342a' or 344a' may be substantially rectangular. In this arrangement, each of the plurality of first and second openings may have a width of between about 3-4 cm. Further, the plurality of first and second openings 342a' and 344a' may be each arranged in a plurality of rows. In this case, a distance between each of the plurality of rows is about 3-4 cm.

As described above, the variable exhaust unit 340 may be disposed in the first position or the second position. In the first position, which provides a relatively low rate of exhaust, the plurality of first openings 342a and the plurality of second openings 344a are misaligned. In the second position, which provides a relatively high rate of exhaust, the plurality of first openings 342a and the plurality of second openings 344a are aligned.

Figure 10A:
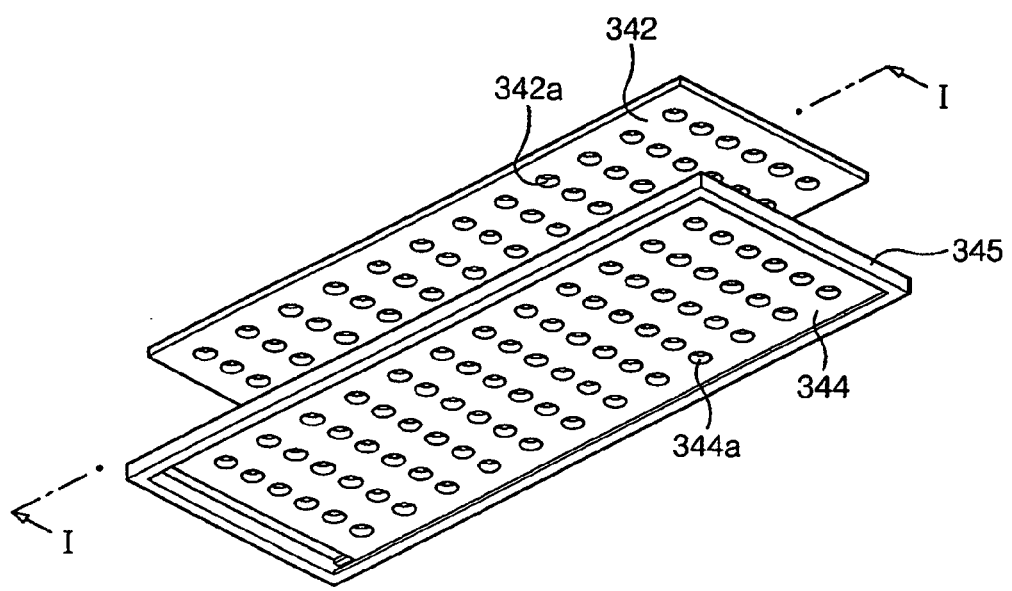
FIGS. 10A and 10B illustrate a perspective view of a variable exhaust unit according to a first embodiment of the present invention in a first position and a cross-sectional view, taken along line I-I of FIG. 10A, of the variable exhaust unit according to the first embodiment of the present invention in the first position, respectively.
Figure 10B:
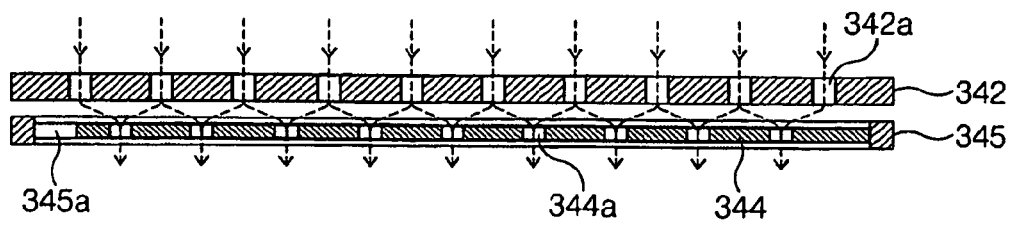
Figure 11A:
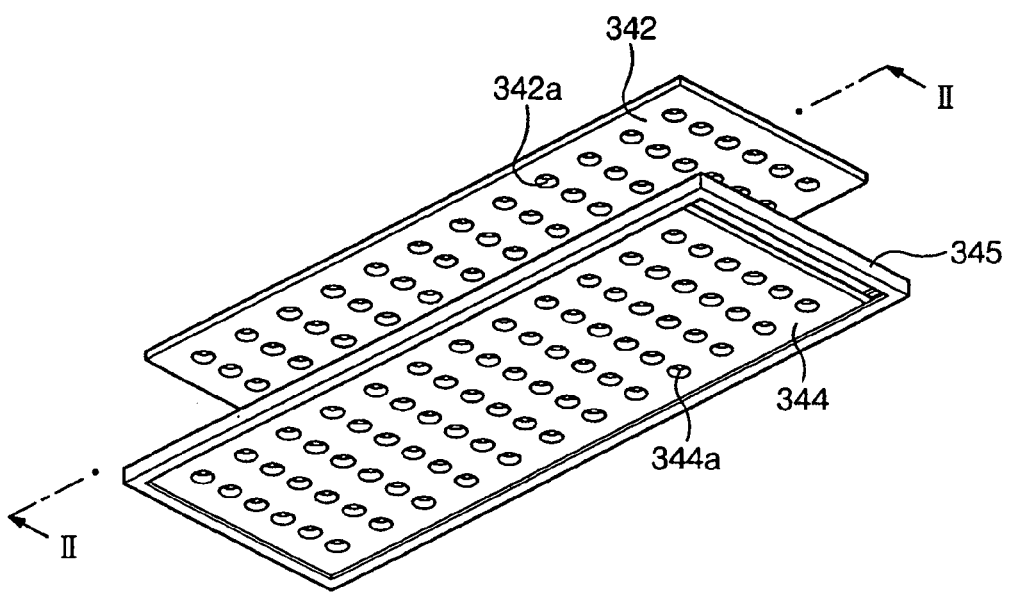
FIGS. 11A and 11B illustrate a perspective view of a variable exhaust unit according to a first embodiment of the present invention in a second position and a cross-sectional view, taken along line II-II of FIG. 11A, of the variable exhaust unit according to the first embodiment of the present invention in the second position, respectively.
Figure 11B:
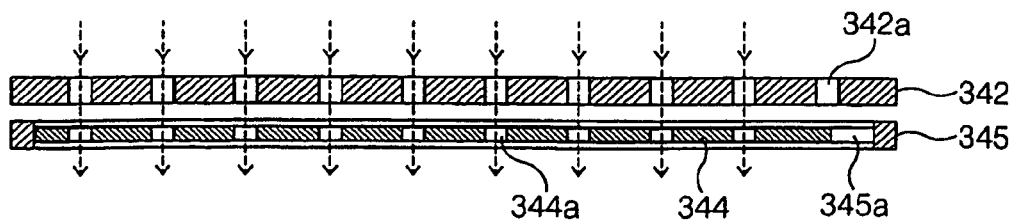

More specifically, FIG. 10A illustrates the first and second exhaust plates 342 and 344 of the variable exhaust unit 340 as shown in FIG. 7 in the first position, wherein the plurality of first openings 342a and the plurality of second openings 344a are misaligned. FIG. 10B illustrates a cross-sectional view of the first and second exhaust plates 342 and 344 of the variable exhaust unit 340 of FIG. 10A taken along line I-I in the first position. FIG. 11A illustrates the first and second exhaust plates 342 and 344 of the variable exhaust unit 340 as shown in FIG. 7 in the second position, wherein the plurality of first openings 342a and the plurality of second openings 344a are aligned. FIG. 11B illustrates a cross-sectional view of the first and second exhaust plates 342 and 344 of the variable exhaust unit 340 of FIG. 11A taken along line II-II in the second position.

In FIGS. 10B and 11B, dotted lines show a direction of airflow exhausted through the first and second exhaust plates 342, 344. As shown in FIG. 10B, if the second exhaust plate 344 moves to the first position in the static state, the exhaust of air is not achieved smoothly from the housing 200 because the flow direction of the air exhausted out of the variable exhaust unit 340 deviates from the flow direction of the air exiting the housing 200.

As shown in FIG. 11B, if the second exhaust plate 344 moves to the second position in the dynamic state, the exhaust of the air can be achieved smoothly from the housing 200 because the flow direction of the air exhausted out of the variable exhaust unit 340 is the same as the flow direction of the air exiting the housing 200.

Further, the smaller the particle size to be removed from the housing 200, the greater an overlap between the plurality of first openings 342a and the plurality of second openings 344a. As the overlap between the plurality of first openings 342a and the plurality of second openings 344a increases, the exhaust rate through the variable exhaust unit 340 increases.

Figure 12A:
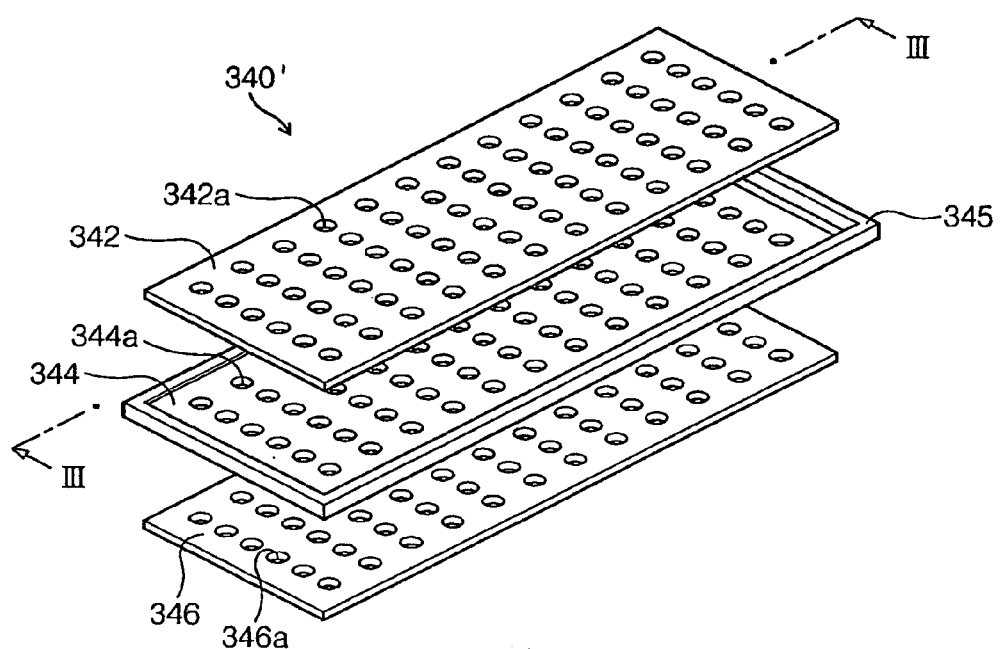
FIGS. 12A and 12B illustrate a perspective view of a variable exhaust unit according to a second embodiment of the present invention and a cross-sectional view, taken along line III-III of FIG. 12A, of the variable exhaust unit according to the second embodiment of the present invention in a first position, respectively.
Figure 12B:
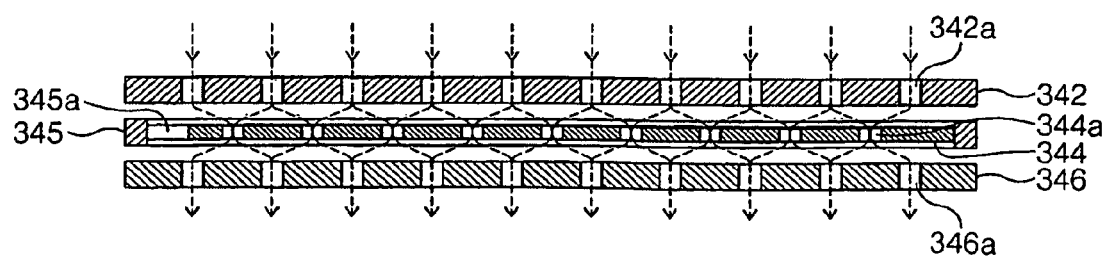

FIG. 12A illustrates a variable exhaust unit 340' according to a second embodiment of the present invention. FIG. 12B illustrates a cross-sectional view of the variable exhaust unit of FIG. 12A taken along line III-III in the first position, wherein a plurality of first openings, a plurality of second openings and a plurality of third openings are misaligned.

The variable exhaust unit 340' according to the second embodiment of the present invention further includes a third exhaust plate 346 having a plurality of third openings 346a, which acts as a third exhaust route. In this arrangement, the first and third exhaust plates 342, 346 are fixed and the second exhaust plate 344, which is disposed therebetween, is operable to move horizontally. The first and second exhaust plates 342 and 344 and the second and third exhaust plates 344 and 346 may be spaced apart by a predetermined distance, e.g., about 1 cm. The third exhaust plate 346 may have substantially the same shape as the first exhaust plate 342. The size and shape of each of the plurality of third openings 346a may be substantially the same or may be different from the size and shape of each of the plurality of first openings 342a.

In the second embodiment, the second exhaust plate 344 includes the guide frame 345. In operation, the plurality of third openings 346a may be fixedly aligned with the plurality of first openings 342a, and the operating mechanism (not shown) moves the second exhaust plate 344 horizontally between the first and third exhaust plates 342 and 346 so as to align or misalign the plurality of second openings 344a in the second exhaust plate 344 with the plurality of first and third openings 342a and 346a.

As shown in FIG. 12B, due to the third exhaust plate 346, air exhaustion may be substantially reduced in the first position because of the multiple deviations in the direction of the air flow. Accordingly, in the static state, exhaustion of air from the housing may be virtually prevented.

Figure 13:
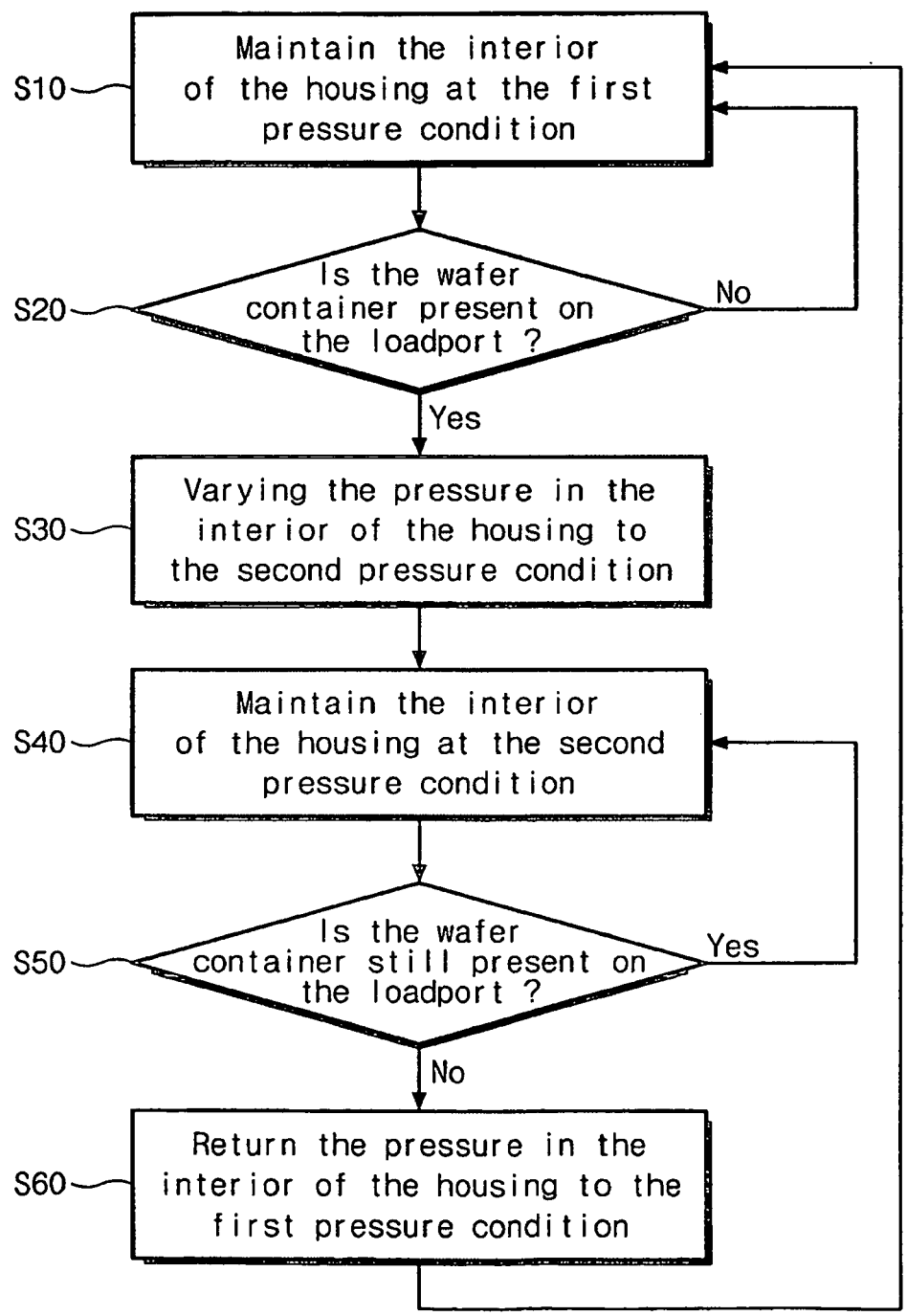
FIG. 13 is a flow chart of a method for adjusting pressure in a housing of the wafer transfer system according to an embodiment of the present invention.

FIG. 13 is a flow chart of a method for adjusting pressure in the housing 200 of the wafer transfer system 40. In step S10, an initial pressure of an interior of the housing 200 is maintained at a first pressure condition, which corresponds to the static state. Because the static state is the default state for the wafer transfer system 40, the first pressure condition, which corresponds to the static state, is the default pressure condition.

In step S20, the wafer container sensor 330 continuously checks for the presence of the wafer container 20 on the loadport 100. The result of this check is transferred to the controller 360. Until the controller 360 receives a loading signal from the wafer container sensor 330 indicating the presence of the wafer container 20, the controller 360 continuously maintains the interior of the housing 200 at the first pressure condition, corresponding to the static state. When the controller 360 receives the loading signal, i.e., the wafer container 20 is present on the loadport 100, the controller 360 recognizes the wafer transfer system 40 has entered the dynamic state.

In step S30, the pressure in the interior of the housing 200 is elevated to a second pressure condition, which corresponds to the dynamic state. To elevate the pressure of the interior of the housing 200 to the second pressure condition corresponding to the dynamic state, the controller 360 signals the second exhaust plate 344 to move to the second position and signals the variable speed fan 322 to increase the blowing speed thereof.

In step S40, the interior of the housing 200 is continuously maintained at the second pressure condition corresponding to the dynamic state.

In step S50, operations of the wafer transfer system 40 proceed. In particular, the door assembly 290 opens the wafer container 20 and a wafer is transferred from the wafer container 20 through the housing 200 and into the process equipment 10 by the wafer transfer robot 280. After the process is completed, the wafer is transferred from the process equipment 10, back through the housing 200, and into the wafer container 20 by the robot 280. Subsequently, the wafer container 20 is closed by the door assembly 290, and the wafer container 20 is removed from the loadport 100. Because the wafer container sensor 330 continuously checks for the presence of the wafer container 20 on the loadport 100, when the wafer container 20 is removed, the wafer container sensor 330 transfers an unloading signal to the controller 360 to indicate the absence of the wafer container 20 from the loadport 100 and the return of the wafer transfer system 40 to the static state.

In step S60, until the controller 360 receives the unloading signal indicating that the wafer container 20 has been removed from the loadport 100, the controller 360 continuously maintains the interior of the housing 200 at the second pressure condition corresponding to the dynamic state. When the controller 360 receives the unloading signal, the controller 360 recognizes that the wafer transfer system 40 has returned to the static state, and the controller 360 sends a signal to the variable speed fan 322 and the variable exhaust unit 340 to reduce the pressure in the interior of the housing 200 back to the first pressure condition corresponding to the static state. To accomplish this pressure change, the controller 360 signals the variable exhaust unit 340 to move the second exhaust plate 344 back to the first position and signals the variable speed fan 322 to reduce the blowing speed thereof.

The method then returns to step S10, in which the interior of the housing 200 is continuously maintained at the first pressure condition corresponding to the static state.

Figure 14:
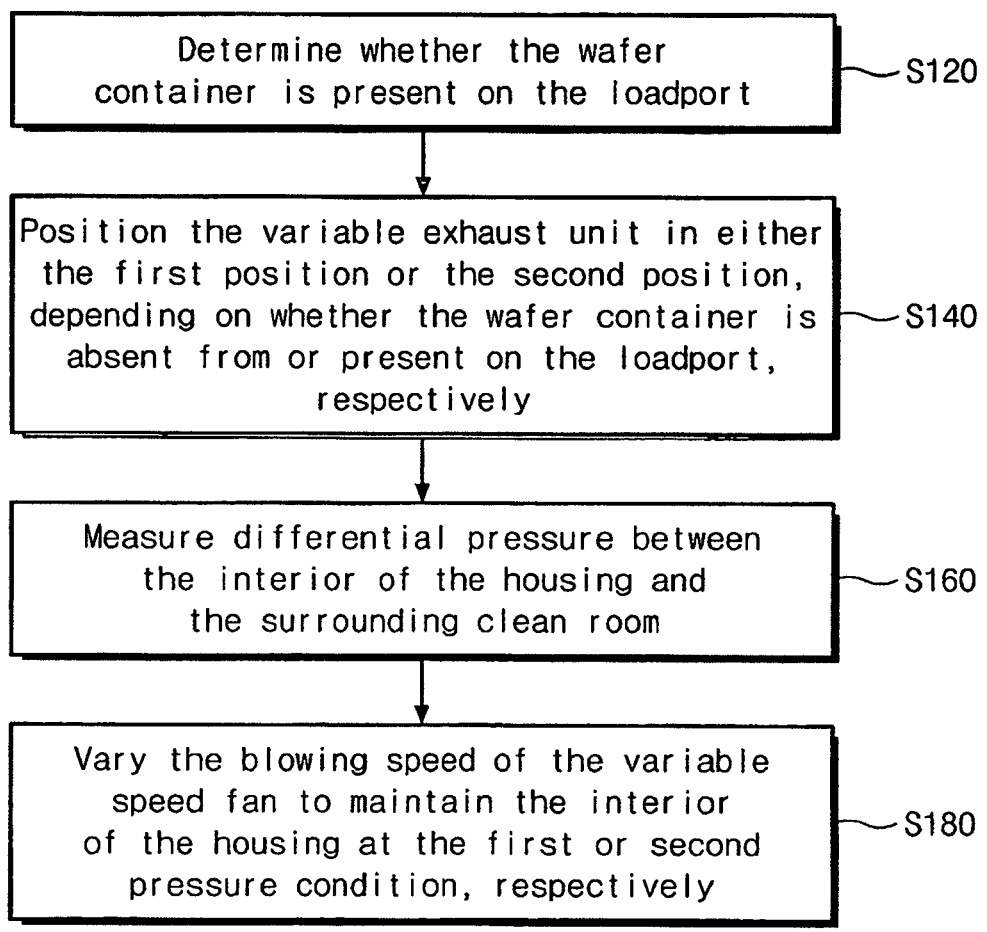
FIG. 14 is a flow chart of a method of varying pressure in an interior of a housing.
Figure 15:
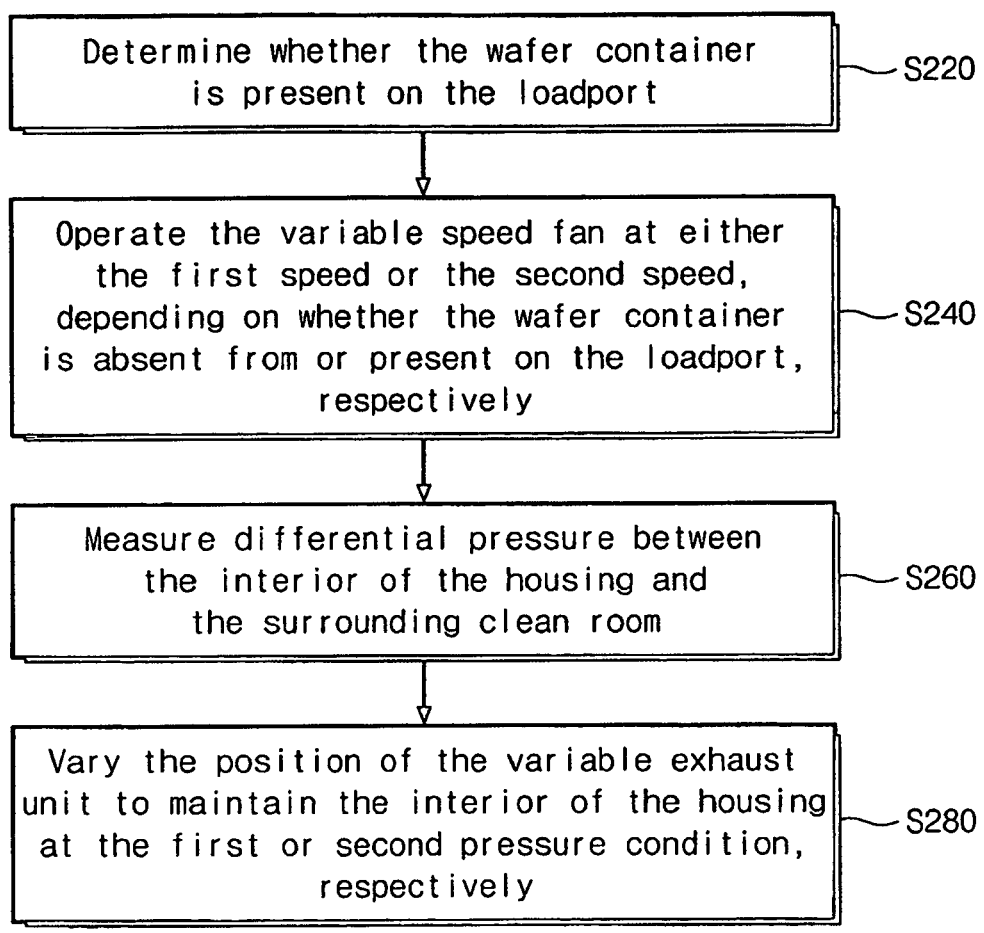
FIG. 15 is a flow chart of another method of varying pressure in an interior of a housing.

FIGS. 14 and 15 are flow charts for explaining methods of varying pressure in the interior of the housing 200 in response to a differential pressure between the interior of the housing 200 and the surrounding clean room 30.

Referring to FIG. 14, in step S120, the wafer container sensor 330 determines whether the wafer container 20 is present on the loadport 100. Step S120 may additionally include the data storage unit 362 storing set points of the pressure conditions and the positions of the variable exhaust unit 340 corresponding to both the static state and the dynamic state of the wafer transfer system 40. The data storage unit 362 may then provide the predetermined information to the controller 360 to control the variable exhaust unit 340.

In step S140, the variable exhaust unit 340 is positioned in either the first position providing a relatively low rate of exhaust or the second position providing a relatively high rate of exhaust depending on whether the wafer container 20 is absent from or present on the loadport 100, respectively.

In the variable exhaust unit 340 according to the first embodiment of the present invention, operating the variable exhaust unit 340 to move from the first position to the second position may include moving either the first or second exhaust plate 342, 344 of the variable exhaust unit 340 relative to the other of the first or second exhaust plate 342, 344 to align the plurality of first openings 342a in the first exhaust plate 342 with the plurality of second openings 344a in the second exhaust plate 344. Operating the variable exhaust unit 340 to move from the second position to the first position may include moving either the first or a second exhaust plate 342, 344 of the variable exhaust unit 340 relative to the other of the first or second exhaust plate 342, 344 to misalign the plurality of first openings 342a in the first exhaust plate 342 with the plurality of second openings 344a in the second exhaust plate 344.

In the variable exhaust unit 340' according to the second embodiment of the present invention, operating the variable exhaust unit to move from the first position to the second position may include moving the second exhaust plate 344 of the variable exhaust unit 340' relative to the first and third exhaust plates 342, 346 to align the plurality of second openings 344a in the second exhaust plate 344 with the plurality of first openings 342a in the first exhaust plate 342 and the plurality of third openings 346a in the third exhaust plate 346. Operating the variable exhaust unit 340' to move from the second position to the first position may include moving the second exhaust plate 344 of the variable exhaust unit 340' relative to the first and third exhaust plates 342, 346 to misalign the plurality of second openings 344a in the second exhaust plate 344 with the plurality of first openings 342a in the first exhaust plate 342 and the plurality of third openings 346a in the third exhaust plate 346.

In step S160, a pressure in the housing 200 and a pressure in the surrounding clean room 30 are measured by the pressure measurer 350 and the pressure difference between the interior and the exterior of the housing 200 is calculated.

In step S180, a blowing speed of the variable speed fan 322 is varied to maintain the interior of the housing 200 in either the first pressure condition or the second pressure condition, depending on whether the wafer container 20 is absent from or present on the loadport 100, respectively.

Referring now to FIG. 15, in step S220, the wafer container sensor 330 detects the presence of the wafer container 20 on the loadport 100. Step S220 may additionally include the data storage unit 362 storing set points of the pressure conditions and the blowing speed of the variable speed fan 322 corresponding to both the static state and the dynamic state of the wafer transfer system 40. The data storage unit 362 may then provide the predetermined information to the controller 360 to control the variable speed fan 322.

In step S240, the variable speed fan 322 is rotated at either the first speed or the second speed depending on whether wafer container 20 is absent from or present on the loadport 100, respectively.

In step S260, a pressure in the housing 200 and a pressure in the surrounding clean room 30 are measured by the pressure measurer 350 and the pressure difference between the interior and the exterior of the housing 200 is calculated.

In step S280, the position of the variable exhaust unit 340 is varied to to maintain the interior of the housing in either the first pressure condition or the second pressure condition, depending on whether the wafer container is absent from or present on the loadport 100, respectively.

In conclusion, controlling the pressure within the housing of the wafer transfer system, and resultantly a differential pressure between the interior and exterior of the housing, depends on the blowing speed of the variable speed fan and the exhaust rate of the variable exhaust unit, which is determined by an amount of overlap of the first and second exhaust plates or the first, second, and third exhaust plates. In the static state, the blowing speed of the variable speed fan is relatively lower and the exhaust rate of the variable exhaust unit is relatively lower to reduce electricity consumption while maintaining a sufficient pressure difference. In the dynamic state, the blowing speed of the variable speed fan is relatively higher and the exhaust rate of the variable exhaust unit is relatively higher to increase an amount of particle contamination removed from the housing while sufficient maintaining a sufficient pressure difference.

As may be seen from the above description, a wafer transfer system and method of controlling pressure in the wafer transfer system according to an embodiment of the present invention is able to increase or decrease a blowing speed of a variable speed fan and correspondingly increase or decrease an exhaust rate of a variable exhaust unit to increase a level of cleanness in the wafer transfer system by reducing a particle residence time in the housing or to reduce electricity consumption of the wafer transfer system, while maintaining a sufficient differential pressure between the interior of the wafer transfer system and the surrounding clean room to prevent contamination of the interior of the housing.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of controlling pressure in a wafer transfer system, the method comprising:
   maintaining a housing of the wafer transfer system under a first pressure;
   sensing whether a wafer container is present on a loadport, which is operably connected to the housing;
   varying an interior pressure condition of the housing from the first pressure to a second pressure, when the wafer container is sensed on the loadport, by operating a variable exhaust unit in the housing to move from a first position providing a relatively low rate of exhaust to a second position providing a relatively high rate of exhaust, and increasing a speed of a variable speed fan in the housing from a first speed to a second speed, the variable exhaust unit and the variable speed fan facing each other;

sensing whether the wafer container is removed from the loadport; and returning the housing to the first pressure, when the wafer container is removed from the loadport, by operating the variable exhaust unit to move from the second position to the first position and decreasing the speed of the variable speed fan from the second speed to the first speed, wherein the first pressure and the second pressure are greater than a pressure in a clean room surrounding the housing.

2. The method of controlling pressure in a wafer transfer system as claimed in claim 1, wherein the first pressure is lower than the second pressure.

3. The method of controlling pressure in a wafer transfer system as claimed in claim 1, wherein, when the wafer container is absent from the loadport, the wafer transfer system is in a first state in which no component of the wafer transfer system is moving and, when the wafer container is disposed on the loadport, the wafer transfer system is in a second state in which one or more component of the wafer transfer system is moving.

4. The method of controlling pressure in a wafer transfer system as claimed in claim 3, wherein the first state is a static state.

5. The method of controlling pressure in a wafer transfer system as claimed in claim 3, wherein the second state is a dynamic state.

6. The method of controlling pressure in a wafer transfer system as claimed in claim 1, wherein operating the variable exhaust unit to move from the first position providing the relatively low rate of exhaust to the second position providing the relatively high rate of exhaust comprises:

moving either a first or a second exhaust plate of the variable exhaust unit relative to the other of the first or second exhaust plate to align a plurality of first openings in the first exhaust plate with a plurality of second openings in the second exhaust plate.

7. The method of controlling pressure in a wafer transfer system as claimed in claim 1, wherein operating the variable exhaust unit to move from the second position providing the relatively high rate of exhaust to the first position providing the relatively low rate of exhaust comprises:

moving either a first or a second exhaust plate of the variable exhaust unit relative to the other of the first or second exhaust plate to misalign a plurality of first openings in the first exhaust plate with a plurality of second openings in the second exhaust plate.

8. The method of controlling pressure in a wafer transfer system as claimed in claim 1, wherein operating the variable exhaust unit to move from the first position providing the relatively low rate of exhaust to the second position providing the relatively high rate of exhaust comprises:

moving a second exhaust plate of the variable exhaust unit relative to a first and a third exhaust plate of the variable exhaust unit to align or misalign a plurality of second openings in the second exhaust plate with a plurality of first openings in the first exhaust plate and a plurality of third openings in the third exhaust plate.

9. The method of controlling pressure in a wafer transfer system as claimed in claim 1, wherein operating the variable exhaust unit to move from the second position providing the relatively high rate of exhaust to the first position providing the relatively low rate of exhaust comprises:

moving a second exhaust plate of the variable exhaust unit relative to a first and a third exhaust plate of the variable exhaust unit to misalign or align a plurality of second openings in the second exhaust plate with a plurality of first openings in the first exhaust plate and a plurality of third openings in the third exhaust plate.

10. The method of controlling pressure in a wafer transfer system as claimed in claim 1, further comprising:

providing predetermined information regarding the first and second speeds of the variable speed fan and regarding the first and second positions of the variable exhaust unit from a data storage part to a controller for operating the variable speed fan and the variable exhaust unit.

11. The method of controlling pressure in a wafer transfer system as claimed in claim 1, further comprising:

measuring a pressure in the interior of the housing and measuring a pressure in the clean room surrounding the housing using a pressure sensor; and determining a differential pressure between the interior of the housing and the clean room.

12. The method of controlling pressure in a wafer transfer system as claimed in claim 11, wherein varying the interior pressure condition of the housing further comprises:

varying a position of the variable exhaust unit to maintain a predetermined pressure condition based on the measured differential pressure between the interior of the housing and the surrounding clean room.

13. The method of controlling pressure in a wafer transfer system as claimed in claim 11, wherein varying the interior pressure condition of the housing further comprises:

varying a blowing speed of the variable speed fan to maintain a predetermined pressure condition based on the measured differential pressure between the interior of the housing and the surrounding clean room.

14. A method of controlling pressure in a wafer transfer system, comprising:

maintaining a housing of the wafer transfer system under a first pressure;

sensing whether a wafer container is present on a loadport, which is operably connected to the housing;

varying an interior pressure condition of the housing from the first pressure to a second pressure, when the wafer container is sensed on the loadport, by operating a variable exhaust unit in the housing to move from a first position providing a relatively low rate of exhaust to a second position providing a relatively high rate of exhaust, sensing whether the wafer container is removed from the loadport; and returning the housing to the first pressure, when the wafer container is removed from the loadport, by operating the variable exhaust unit to move from the second position to the first position, wherein operating the variable exhaust includes moving a second exhaust plate of the variable exhaust unit relative to a first and a third exhaust plate of the variable exhaust unit to align or misalign a plurality of second openings in the second exhaust plate with a plurality of first openings in the first exhaust plate and a plurality of third openings in the third exhaust plate.

15. The method of controlling pressure in a wafer transfer system as claimed in claim 14, further comprising:
  measuring a pressure in the interior of the housing and measuring a pressure in a clean room surrounding the housing using a pressure sensor; and
  determining a differential pressure between the interior of the housing and the clean room.

16. The method of controlling pressure in a wafer transfer system as claimed in claim 14, wherein varying the interior pressure condition of the housing further comprises:
  varying a position of the variable exhaust unit to maintain a predetermined pressure condition based on the measured differential pressure between the interior of the housing and the surrounding clean room.

17. A method of controlling pressure in a wafer transfer system, the method comprising:
  maintaining a housing of the wafer transfer system under a first pressure;
  sensing whether a wafer container is present on a loadport, which is operably connected to the housing;
  varying an interior pressure condition of the housing from the first pressure to a second pressure, when the wafer container is sensed on the loadport, by operating a variable exhaust unit in the housing to move from a first position providing a relatively low rate of exhaust to a second position providing a relatively high rate of exhaust, and increasing a speed of a variable speed fan in the housing from a first speed to a second speed, the variable exhaust unit and the variable speed fan facing each other;
  sensing whether the wafer container is removed from the loadport; and
  returning the housing to the first pressure, when the wafer container is removed from the loadport, by operating the variable exhaust unit to move from the second position to the first position and decreasing the speed of the variable speed fan from the second speed to the first speed,
  wherein, when the wafer container is absent from the loadport, the wafer transfer system is in a first state in which no component of the wafer transfer system is moving and, when the wafer container is disposed on the loadport, the wafer transfer system is in a second state in which one or more component of the wafer transfer system is moving.

18. The method of controlling pressure in a wafer transfer system as claimed in claim 17, wherein the first state is a static state.

19. The method of controlling pressure in a wafer transfer system as claimed in claim 17, wherein the second state is a dynamic state.

* * * * *